(12) United States Patent
Hu et al.

(10) Patent No.: US 12,740,467 B2
(45) Date of Patent: Sep. 15, 2026

(54) STRESS MITIGATING PILLAR BUMPS

(71) Applicant: QUALCOMM Incorporated, San Diego, CA (US)

(72) Inventors: Wei Hu, San Diego, CA (US); Dongming He, San Diego, CA (US); Zhaozhi Li, San Diego, CA (US); Yangyang Sun, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 377 days.

(21) Appl. No.: 18/526,165

(22) Filed: Dec. 1, 2023

(65) Prior Publication Data

US 2025/0183211 A1 Jun. 5, 2025

(51) Int. Cl.

| | |
|---|---|
| ***H10W 72/20*** | (2026.01) |
| ***H10W 72/00*** | (2026.01) |
| ***H10W 72/30*** | (2026.01) |
| *H10W 74/15* | (2026.01) |
| *H10W 90/00* | (2026.01) |

(52) U.S. Cl.

CPC ........... *H10W 72/20* (2026.01); *H10W 72/30* (2026.01); *H10W 72/851* (2026.01); *H10W 72/227* (2026.01); *H10W 72/232* (2026.01); *H10W 72/248* (2026.01); *H10W 74/15* (2026.01); *H10W 90/724* (2026.01); *H10W 90/734* (2026.01)

(58) Field of Classification Search

None

See application file for complete search history.

(56) References Cited

U.S. PATENT DOCUMENTS

| | | | |
|---|---|---|---|
| 2017/0250153 | A1 | 8/2017 | Kikuchi et al. |
| 2021/0175084 | A1 | 6/2021 | Farooq et al. |
| 2022/0302011 | A1 | 9/2022 | Lin et al. |

OTHER PUBLICATIONS

International Search Report and Written Opinion—PCT/US2024/055355—ISA/EPO—Feb. 6, 2025.

Islam et al. "Fine Pitch Cu Pillar Assembly Challenges for Advanced Flip Chip Package", International Wafer Level Packaging Conference, San Jose, CA, Oct. 24-25, 2017, pp. 1-7.

*Primary Examiner* — Anthony Ho

(74) *Attorney, Agent, or Firm* — Moore IP

(57) ABSTRACT

A die includes a plurality of pillar bumps configured to electrically connect the die to a substrate. The plurality of pillar bumps includes at least one first pillar bump having a first total pillar bump height. The at least one first pillar bump includes a first pillar having a first pillar height and a first solder cap having a first solder cap height. The plurality of pillar bumps includes at least one second pillar bump having a second pillar height substantially equal to the first total pillar bump height. The at least one second pillar bump includes a second pillar having a second pillar height and a second solder cap having a second solder cap height. The second pillar height is greater than the first pillar height, and the second solder cap height is less than the first solder cap height.

31 Claims, 9 Drawing Sheets

STRESS MITIGATING PILLAR BUMPS

FIELD

Various features relate to pillar bumps for stress mitigation in integrated devices.

BACKGROUND

Advances in technology have enabled manufacture of semiconductor devices that are thinner and have a smaller form factor than previous generations of devices while often providing higher performance, lower power demand, or both. Such advances increasingly drive improvements in related technologies, such as battery technologies and packaging technologies. For example, semiconductor technology advances generally result in dies that have more complex circuitry (e.g., transistors) per unit area, finer line widths, narrower line spacing, thinner layers, etc. Dies with more complex circuitry often have an increased need for input/output (I/O) connections; however, there is often also an expectation that packaged devices with more advanced dies have the same or smaller form factor as prior generations of devices.

Packaging technologies have advanced to address these conflicting demands. For example, for the most demanding applications, more traditional wire bond packaging technologies have largely been replaced by flip chip technologies. Using flip chip technologies, most or all of one surface of a die can be used for I/O connections, providing a significant increase over wire bond packaging. However, using flip chip technologies introduces additional challenges. For example, traditional solder balls and solder bumps used for flip chip connections are heated to reflow to form bonds between a flip chip die and a substrate. This heating can introduce stresses due to differential expansion of various materials of the die and the substrate. Additionally, when the solder reflows, tightly spaced solder balls or solder bumps can merge to form solder bridges that short circuits together leading to failures.

Pillar bumps have replaced traditional solder balls and solder bumps for some applications. Pillar bumps enable use of smaller and more closely spaced interconnects; however, die attach operations using pillar bumps can still result in failures due to solder bridging and differential thermal expansion. Additionally, the chip-package interaction (CPI) stresses associated with pillar bumps can be more problematic than the CPI stresses associated with solder balls in part because pillar bumps tend to be more rigid than solder balls, and thus transfer more of the CPI stresses to underlying components of the die, the substrate, or both.

SUMMARY

Various features relate to integrated circuit devices.

One example provides a device that includes a die. The die includes a plurality of pillar bumps configured to electrically connect the die to a substrate. The plurality of pillar bumps include at least one first pillar bump having a first total pillar bump height. The at least one first pillar bump includes a first pillar having a first pillar height and a first solder cap having a first solder cap height. The plurality of pillar bumps include at least one second pillar bump having a second pillar height substantially equal to the first total pillar bump height. The at least one second pillar bump includes a second pillar having a second pillar height and a second solder cap having a second solder cap height. The second pillar height is greater than the first pillar height, and the second solder cap height is less than the first solder cap height.

Another example provides an integrated device that includes a substrate comprising a plurality of contacts and a die comprising integrated circuitry electrically connected to the plurality of contacts via a plurality of pillar bumps. The plurality of pillar bumps includes at least one first pillar bump that includes a first pillar having a first pillar height and a first solder cap having a first solder cap height. The plurality of pillar bumps also includes at least one second pillar bump that includes a second pillar having a second pillar height and a second solder cap having a second solder cap height. The second pillar height is greater than the first pillar height, and the second solder cap height is less than the first solder cap height.

Another example provides a method for fabricating an integrated device. The method includes electrically connecting at least one first pillar bump of a die to a first contact of a substrate. The first pillar bump includes a first pillar having a first pillar height and a first solder cap having a first solder cap height. The method also includes electrically connecting at least one second pillar bump of the die to a second contact of the substrate. The second pillar bump includes a second pillar having a second pillar height and a second solder cap having a second solder cap height. The second pillar height is greater than the first pillar height, and the second solder cap height is less than the first solder cap height.

Another example provides a method for fabricating an integrated device. The method includes forming, on a first contact of a die, a first pillar having a first pillar height. The method also includes forming, on the first pillar, a first solder cap having a first solder cap height. The method also includes forming, on a second contact of the die, a second pillar having a second pillar height, where the second pillar height is greater than the first pillar height. The method also includes forming, on the second pillar, a second solder cap having a second solder cap height, where the second solder cap height is less than the first solder cap height.

BRIEF DESCRIPTION OF THE DRAWINGS

Various features, nature and advantages may become apparent from the detailed description set forth below when taken in conjunction with the drawings in which like reference characters identify correspondingly throughout.

DETAILED DESCRIPTION

Figures 1, 2:
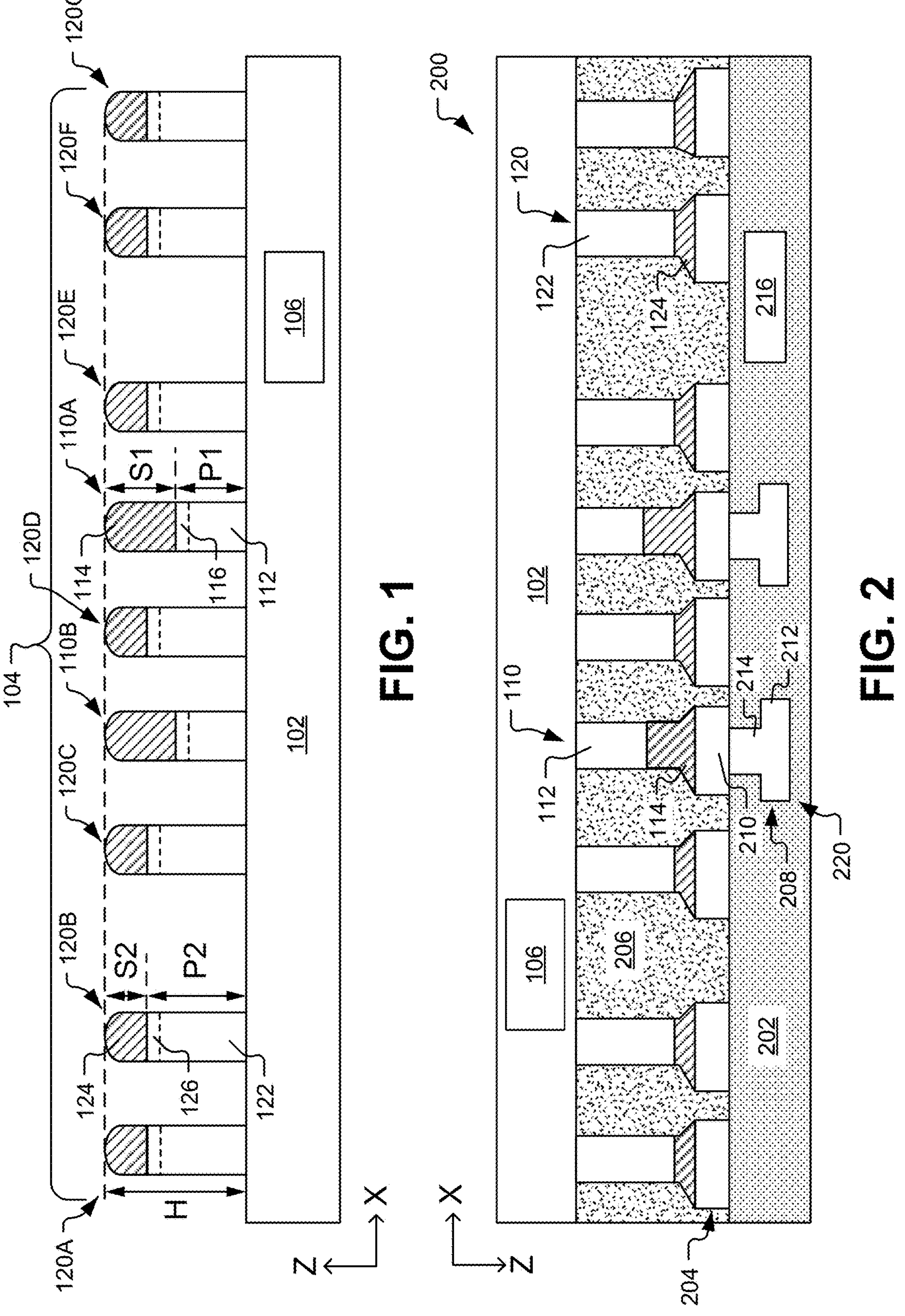
FIG. 1 illustrates a schematic cross-sectional profile view of a die with a set of pillar bumps including pillars of different pillar heights and solder caps of different solder cap heights.
FIG. 2 illustrates a schematic cross-sectional profile view of an integrated device that includes the die of FIG. 1 and a substrate.

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Particular aspects of the present disclosure are described below with reference to the drawings. In the description, common features are designated by common reference numbers. As used herein, various terminology is used for the purpose of describing particular implementations only and is not intended to be limiting of implementations. For example, the singular forms "a," "an," and "the" are intended to include the plural forms as well, unless the context clearly indicates otherwise. Further, some features described herein are singular in some implementations and plural in other implementations. For ease of reference herein, such features are generally introduced as "one or more" features and are subsequently referred to in the singular or optional plural (as indicated by "(s)") unless aspects related to multiple of the features are being described.

In some drawings, multiple instances of a particular type of feature are used. Although these features are physically and/or logically distinct, the same reference number is used for each, and the different instances are distinguished by addition of a letter to the reference number. When the features as a group or a type are referred to herein (e.g., when no particular one of the features is being referenced), the reference number is used without a distinguishing letter. However, when one particular feature of multiple features of the same type is referred to herein, the reference number is used with the distinguishing letter. For example, referring to FIG. 1, multiple instances of a first type of pillar bump 110 are illustrated and associated with reference numbers 110A and 110B. When referring to a particular one of these pillar bumps, such as a pillar bump 110A, the distinguishing letter "A" is used. However, when referring to any arbitrary one of these pillar bumps or to these pillar bumps as a group, the reference number 110 is used without a distinguishing letter.

As used herein, the terms "comprise," "comprises," and "comprising" may be used interchangeably with "include," "includes," or "including." As used herein, "exemplary" indicates an example, an implementation, and/or an aspect, and should not be construed as limiting or as indicating a preference or a preferred implementation. As used herein, an ordinal term (e.g., "first," "second," "third," etc.) used to modify an element, such as a structure, a component, an operation, etc., does not by itself indicate any priority or order of the element with respect to another element, but rather merely distinguishes the element from another element having a same name (but for use of the ordinal term). As used herein, the term "set" refers to one or more of a particular element, and the term "plurality" refers to multiple (e.g., two or more) of a particular element.

Improvements in manufacturing technology and demand for lower cost and more capable electronic devices has led to increasing complexity of integrated circuits (ICs). Often, more complex ICs have more complex interconnection schemes to enable interaction between ICs of a device. The number of interconnect levels for circuitry has substantially increased due to the large number of devices that are now interconnected in a state-of-the-art mobile application device.

These interconnections include back-end-of-line (BEOL) interconnect layers, which may refer to the conductive interconnect layers for electrically coupling to front-end-of-line (FEOL) active devices of an IC. The various BEOL interconnect layers are formed at corresponding BEOL interconnect levels, in which lower BEOL interconnect levels generally use thinner metal layers relative to upper BEOL interconnect levels. The BEOL interconnect layers may electrically couple to middle-of-line (MOL) interconnect layers, which interconnect to the FEOL active devices of an IC. As used herein, the term "layer" includes a film, and should not be construed as indicating a vertical or horizontal thickness unless otherwise stated.

State-of-the-art mobile application devices demand a small form factor, low cost, a tight power budget, and high electrical performance. Stacked die schemes and chiplet architectures are becoming more common as significant power performance area (PPA) yield enhancements are demonstrated for stacked die and chiplet architecture product lines. Unfortunately, stacked die schemes can involve high power density targets, which impose significant power distribution inefficiencies. As used herein, the term "chiplet" may refer to an integrated circuit block, a functional circuit block, or other like circuit block specifically designed to work with one or more other chiplets to form a larger, more complex chiplet architecture.

Pillar bumps are commonly used to form interconnects between components of integrated circuit devices (e.g., die-to-die connections for 3D die stack devices, die-to-interposer connections for 2D devices or 2.5D stack devices, or die-to-package connections for 2D devices). For example, a flip chip die can include a set of pillar bumps arranged to form electrical connections between circuitry of the die and circuitry of a substrate (which may include or correspond to another die). Each pillar bump generally includes a metal pillar or post coupled to the flip chip die and topped by a solder cap. One benefit of this arrangement is that, as compared to conventional solder ball interconnects, pillar bumps can be used with a significantly tighter pitch.

The height of the solder cap can influence reliability of an integrated circuit device that uses pillar bumps. For example, when large volumes of solder are used for the solder caps of tightly spaced (e.g., fine pitch) pillar bumps, solder of adjacent pillar bumps can be squeezed out during assembly resulting in solder bridging. Such solder bridging can form electrical shorts between the adjacent pillar bumps resulting in device failure. However, larger solder caps reduce mechanical stresses in the assembled device better than smaller solder caps since the material of the solder cap is generally more compliant than the material of the metal pillar. For example, a small solder volume can lead to various types of mechanical failures and reliability concerns during and after assembly.

In addition to these reliability challenges, pillar bumps used for interconnection between a die and a substrate can present certain design limits for the device. For example, it is generally desirable to provide short power and ground paths between a flip chip die and a substrate because shorter and more direct conductive paths improve power distribution network performance (e.g., by limiting impedance). One way to provide a short power or ground path is to use an aligned vertical interconnect structure (e.g., a pillar bump connected to a via-in-pad structure, collectively referred to as a via-in-bump (VIB) structure) to connect a power or ground conductor of a substrate to a corresponding power or ground conductor of the flip chip die. However, such structures tend to be relatively rigid, which presents challenges with thermal expansion cracking. For example, various techniques that use heat and pressure (e.g., thermal compression bonding techniques, such as thermocompression-capillary underfill (TC-CUF) techniques) can be used during assembly of flip chip devices that use pillar bumps for electrical interconnection. Thermal expansion differences between various materials used in thermal compression bonding can introduce mechanical stresses that lead to solder cracks. For example, underfill material used in TC-CUF techniques can have different thermal expansion properties than the materials of the pillar bumps. The likelihood of formation of such solder cracks can be reduced by using larger solder volumes (on the pillar bumps or on a combination of the pillar bumps and pads) or by avoiding use of TC-CUF (thereby avoiding use of underfill material); however, TC-CUF is often the best option for providing a void-free fill between fine pitch bumps. Thus, package designers may be unable to use aligned vertical interconnect structures for packages that have fine pillar bump pitch that will be assembled using TC-CUF.

Disclosed embodiments solve the above-described problems (and others) by interconnecting a die to a substrate using a pillar bump array that includes pillar bumps that are each of the same total height but with different solder heights. For example, the pillar bump array can include a first pillar bump that includes a first pillar having a first pillar height and a first solder cap having a first solder cap height, and the pillar bump array can include a second pillar bump that includes a second pillar having a second pillar height and a second solder cap having a second solder cap height. In this example, the first pillar height is different from the second pillar height, and the first solder cap height is different from the second solder cap height; however, the total height of the first pillar plus the first solder cap is substantially the same as the total height of the second pillar plus the second solder cap. The first and second pillar bumps can be selectively positioned to limit solder bridging while also reducing mechanical stresses. For example, pillar bumps with taller solder caps can be positioned at locations that are subject to high mechanical stresses or high failure risk, such as over via-in-pad structures, at corners of a die, or other recognized high stress locations, and remaining pillar bumps and/or bumps in low pitch configurations can use shorter solder caps to reduce the risk of solder bridging.

In some embodiments, the pillar bumps of an array of pillar bumps can also differ in other respects. For example, some of the pillar bumps can include a diffusion barrier layer between the pillar and the solder cap, which can affect the pliability of the solder cap after attachment. As another example, different solder compositions can be used for different solder caps, and the different solder compositions can provide different thermal and/or mechanical properties.

Exemplary Device Comprising a Die with Pillar Bumps Having Different Pillar Heights FIG. 1 illustrates a schematic cross-sectional profile view of a die 102 with a set of pillar bumps 104 according to a particular embodiment of the disclosure. FIG. 2 illustrates a schematic cross-sectional profile view of an integrated device 200 that includes the die 102 of FIG. 1 and a substrate 202.

The die 102 is a semiconductor-based integrated circuit component with a flip-chip configuration. For example, the die 102 includes circuitry 106 that is electrically connected to the pillar bumps 104, and the pillar bumps 104 are arranged to form an array of electrical interconnects on a surface of the die 102. In this context, the term "array" should be understood broadly to include periodic and non-periodic arrangements that extend in two dimensions, such as along an XY-plane in the orientation illustrated in FIG. 1.

The pillar bumps 104 of the die 102 facilitate formation of electrical connections between the circuitry 106 of the die 102 and off-die circuitry, such as circuitry 216 integrated within or electrically connected to the substrate 202. The circuitry 106 of the die 102 can include, for example, a power management integrated circuit (PMIC), one or more logic circuits (e.g., an application processor, a digital signal processor, a graphics processor, etc.), one or more memory circuits (e.g., Dynamic Random-Access Memory (DRAM) circuitry), one or more communication circuits (e.g., a modem, a radio frequency (RF) device, a transmitter, a receiver, etc.), or other types of semiconductor-based integrated circuits. Components of the circuitry 106 can include, for example, different types of transistors, such as a field effect transistor (FET), planar FET, finFET, a gate all around FET, or mixtures of transistor types. In some implementations, a front end of line (FEOL) process may be used to fabricate the circuitry 106 in and/or over the semiconductor substrate. As a semiconductor-based integrated circuit, the circuitry 106 is formed in or on a semiconductor material, such as silicon, silicon carbide, gallium arsenide, gallium nitride, germanium, etc.

In FIG. 1, each of the pillar bumps 104 includes at least a pillar and a solder cap. For example, in FIG. 1, the pillar bumps 104 include a first set of pillar bumps 110 (including pillar bump 110A and pillar bump 110B) that each include a pillar 112 and a solder cap 114, and a second set of pillar bumps 120 (including pillar bumps 120A, 120B, 120C, 120D, 120E, 120F, and 120G) that each include a pillar 122 and a solder cap 124. Optionally, one or more of the pillar bumps 104 may also include one or more additional layers. For example, the pillar bump 110A can optionally include a barrier layer 116. As another example, the pillar bump 120B can optionally include a barrier layer 126. The pillar of each of the pillar bumps 104 is generally a plated or deposited metal (or alloy), such as copper, and the solder cap of each of the pillar bumps 104 is generally a lead-free solder that includes tin, silver, optionally other metals (e.g., nickel, copper, or zinc), or alloys thereof.

One benefit of using pillar bumps 104 for electrical interconnection of the die 102, as compared to using solder balls or solder bumps for the electrical interconnects, is that the pillar bumps 104 can be arranged with finer pitches, thereby enabling more input/output (IO) connections to the die 102. However, tightly spaced pillar bumps 104 can present manufacturing and reliability challenges. For example, solder of the solder caps 114, 124 can be squeezed out during die attach operations resulting in electrical shorts between adjacent pillar bumps due to solder bridging. The risk of solder bridging is generally greater for more closely spaced (i.e., finer pitch) pillar bumps 104 and for pillar bumps 104 with more solder volume to be displaced. Accordingly, one way to reduce the risk of solder bridging is to reduce the solder cap height of the pillar bumps 104. However, the material of the pillars of the pillar bumps 104 is generally more rigid than the solder of the solder caps. As a result, decreasing solder cap height increases the risk of stress-related failures.

In a particular aspect of the disclosure, each of the above-described problems is addressed by using pillar bumps 104 with two or more different configurations. For example, the pillar bumps 110 each include a first pillar 112 having a first pillar height P1 and a first solder cap 114 having a first solder cap height S1, and the pillar bumps 120 each include a second pillar 122 having a second pillar height P2 and a second solder cap 124 having a second solder cap height S2. Although the total pillar heights H of the pillar bumps 104 (including the pillar bump(s) 110 and the pillar bump(s) 120) are substantially equal, the first pillar height P1 is greater than the second pillar height P2, and the first solder cap height S1 is less than the second solder cap height S2.

The arrangement of the pillar bumps 104 can be organized to address challenges specific to a particular configuration. For example, among the pillar bumps 104, the pillar bump(s) 110 can be disposed at selected locations to reduce chip-package interaction stresses. The pillar bump(s) 120 can be disposed at selected locations to support the pillar bump(s) 110 to reduce the risk of solder bridging due to the increased solder height of the pillar bump(s) 110. Thus, the pillar bump(s) 110 can reduce the likelihood of stress-related failures, and the pillar bump(s) 120 can facilitate close spacing of the set of pillar bumps 104. Specific examples of selective positioning of the pillar bumps 110, 120 are illustrated and described below with reference to FIGS. 2-7.

In some embodiments, the pillar bump(s) 110 and the pillar bump(s) 120 are similar to one another except with regard to placement location in the array of electrical interconnects of the die 102 and relative heights of the pillar and solder cap of each. In other embodiments, the pillar bump(s) 110 differ from the pillar bump(s) 120 in other respects. For example, the first solder cap(s) 114 of the pillar bump(s) 110 can include a different metal or alloy than the second solder cap(s) 124 of the pillar bump(s) 120. Additionally, or alternatively, the first pillar 112 of the pillar bump(s) 110 can include a different metal or alloy than the second pillar 122 of the pillar bump(s) 120. To illustrate, the second solder cap(s) 124 and/or the second pillar(s) 122 can be formed using materials that are less rigid than materials used to form the first solder cap(s) 114 and/or the first pillar(s) 112 to reduce CPI stresses associated with the pillar bump(s) 120. As another example, the pillar bump(s) 110 can have different shapes and/or different dimensions (e.g., different diameters, different areas, etc.) in an XY plane in the orientation illustrated in FIG. 1 than the pillar bump(s) 120 do.

FIG. 2 illustrates one example of selective placement of the pillar bumps 110, 120 to reduce CPI stresses while enabling fine pitch arrangement of the pillar bumps 104. In FIG. 2, the substrate 202 includes a set of contacts 204 (also referred to as "pads) arranged to interface with the pillar bumps 104 of the die 102.

In FIG. 2, some of the contacts 204 (such as contact 210) have a via-in-pad structure. In a via-in-pad structure, a pad (e.g., the contact 210), a conductive via (e.g., a conductive via 214) electrically connected to the pad, and a contact or trace of an underlying metal layer (e.g., contact 212 of metal layer 208) are vertically aligned (e.g., in the orientation illustrated in FIG. 2). Via-in-pad structures provide short conductive paths, and short conductive paths are often desirable for a variety of reasons, such as improved power distribution network performance. However, via-in-pad structures are associated with a higher risk of stress related failures (such as cracking or delamination of a dielectric layer underlying the contact 212) because via-in-pad structures are relatively rigid and aligned in a manner that tends to transfer forces to fragile layers of the device 200 due to differential thermal expansion. Because of this increased risk of failures, chip package designers may avoid using via-in-pad structures in particular areas.

In the example illustrated in FIG. 2, one of the pillar bump(s) 110 is electrically connected to the via-in-pad structure 220. The additional solder cap height of the solder cap 114 of the pillar bump 110 (relative to the solder cap heights of the solder caps 124 of the pillar bump(s) 120) provides stress relief to reduce stresses transferred to the other components of the device 200, such as layers underlying the contact 212. At the same time, the pillar bump(s) 120 of the die 102 are electrically connected to other contacts 204 of the substrate 202 to reduce the risk of the solder of the solder cap 114 spreading out to cause solder bridging. Thus, the pillar bump(s) 110 reduce the risks associated with CPI stresses, and the pillar bump(s) 120 reduce the risks associated with solder bridging, enabling use of via-in-pad structures in locations where such structures would generally be avoided.

The device 200 of FIG. 2 also includes a fill material 206 disposed in a region between the die 102 and the substrate 202. The fill material 206 generally includes a polymer-based material, such as an epoxy. The fill material 206 provides mechanical reinforcement to the device 200. In some embodiments, the pillar bumps 104 are coupled to the contacts 204 of the substrate 202 using a thermocompression process, and the fill material 206 is subsequently applied as a low viscosity fluid that flows, via capillary action, between the pillar bumps 104 to reduce the risk of voids between the pillar bumps 104. In other embodiments, the fill material 206 is applied as a paste-like material to the die 102, and subsequently, the pillar bumps 104 are coupled to contacts 204 of the substrate 202 using a thermocompression process. In either of these embodiments, the fill material 206 helps with providing relatively uniform thermal and mechanical properties in a region between the die 102 and the substrate 202.

While the examples illustrated in FIGS. 1 and 2 show particular configurations and arrangements of pillar bumps 110, 120 with different solder cap heights, other configurations are envisioned. For example, in other embodiments, a die (e.g., the die 102) can include pillar bumps with more than two different configurations, such as the pillar bumps 110 with first solder cap heights, the pillar bumps 120 with second solder cap heights, and a third set of pillar bumps with third solder cap heights (where the first, second, and third solder cap heights are different from one another). As another example, two or more of the pillar bumps 110 can have different sizes or shapes than one another in an XY plane in the orientation illustrated in FIGS. 1 and 2. To illustrate, a first set of the pillar bumps 110 can have a first characteristic dimension (e.g., a first diameter) in the XY plane and a second set of the pillar bumps 110 can have a second characteristic dimension (e.g., a second diameter) in the XY plane. Additionally, or alternatively, a first set of the pillar bumps 120 can have a first characteristic dimension (e.g., a first diameter) in the XY plane and a second set of the pillar bumps 120 can have a second characteristic dimension (e.g., a second diameter) in the XY plane. Further, the specific number of pillar bumps 104 (as well as the specific number of each of the pillar bumps 110 and 120) shown in each of FIGS. 1-8B is merely illustrative.

FIGS. 3-7 illustrate various schematic bottom views of the die 102 with various configurations of the pillar bumps 104. In FIGS. 3-7, the pillar bumps 110 are distinguished from the pillar bumps 120 using different fill patterns.

Figure 3:
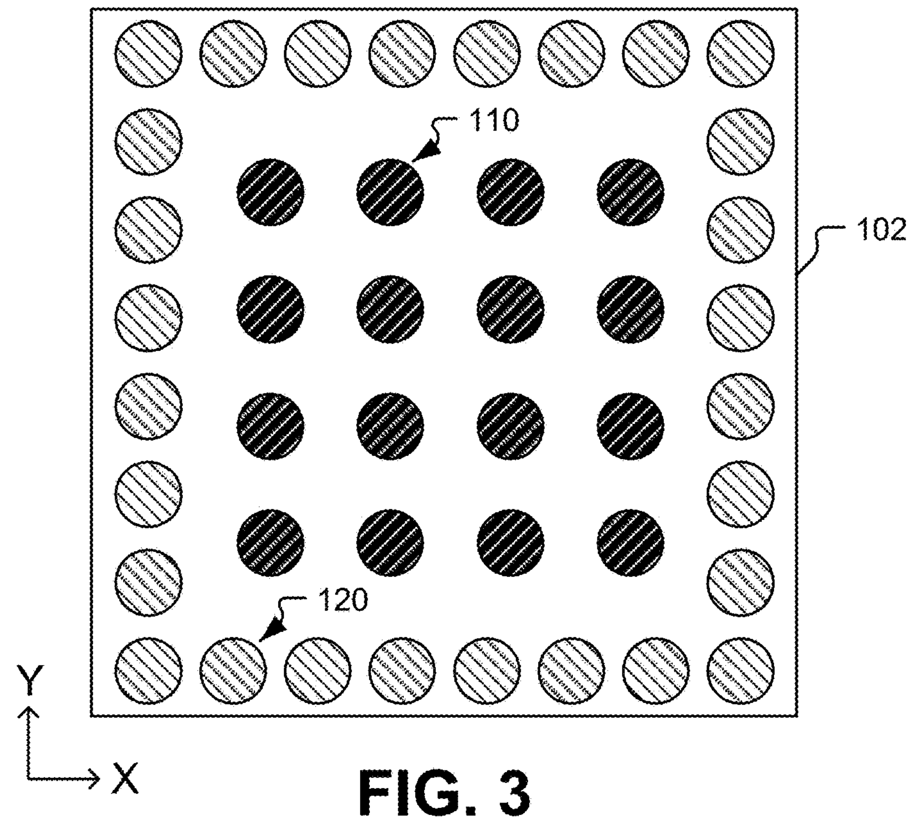
FIG. 3 illustrates a schematic bottom view of an example of the die of FIG. 1.
Figure 4:
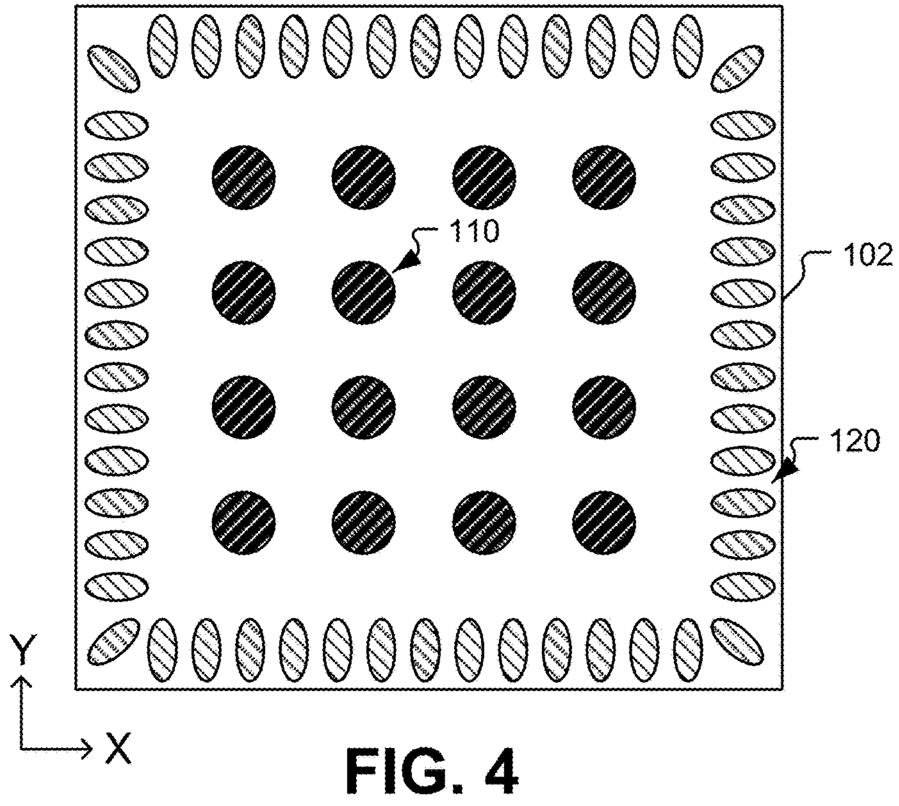
FIG. 4 illustrates a schematic bottom view of another example of the die of FIG. 1.

In FIGS. 3 and 4, a plurality of the pillar bumps 110 are disposed in a core region of a surface of the die 102, and a plurality of second pillar bumps 120 are disposed in a periphery region of the surface of the surface of the die 102. In FIG. 3, the pillar bumps 110 have the same size (e.g., the same characteristic dimension) and shape in the XY plane as the pillar bumps 120. In FIG. 4, the pillar bumps 110 have a different size (e.g., a different characteristic dimension) and shape in the XY plane from the pillar bumps 120. The pillar bumps 120 help to maintain a desired solder height during assembly (e.g., to limit solder squeeze out and the risk of solder bridging) among the pillar bumps 110. The pillar bumps 110 reduce CPI stresses in the core region (relative to traditional configurations in which all of the pillar bumps have the same solder cap height). Additionally, due to use of the pillar bumps 110 in the core region, a substrate configured to be coupled to the die 102 (e.g., the substrate 202 of FIG. 2) can include via-in-pad structures in the core region without significant risk of mechanical failures. Including via-in-pad structures in the core region can improve performance of a PDN of the die 102.

Figure 5:
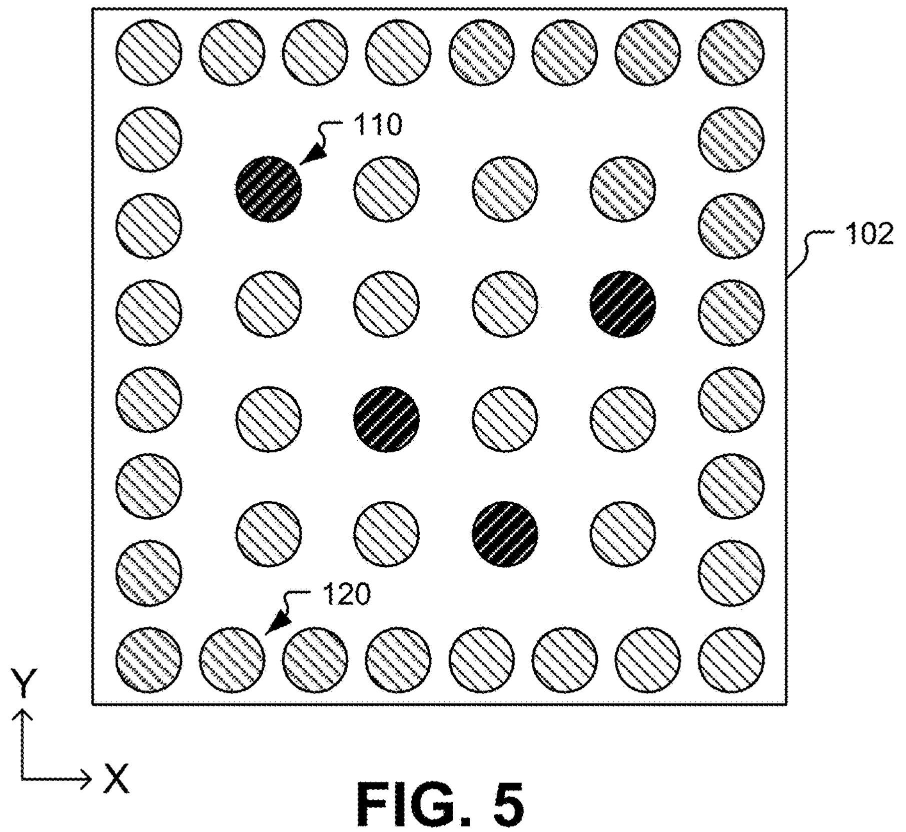
FIG. 5 illustrates a schematic bottom view of another example of the die of FIG. 1.

In FIG. 5, the core region includes one or more pillar bumps 110 and one or more pillar bumps 120. For example, the pillar bumps 110 can be selectively positioned at locations associated with higher CPI stresses, such as over via-in-pad structures or other locations that have experienced higher incidences of failure due to CPI stress. The specific locations illustrated in FIG. 5 are merely illustrative and should not be considered limiting.

Figure 6:
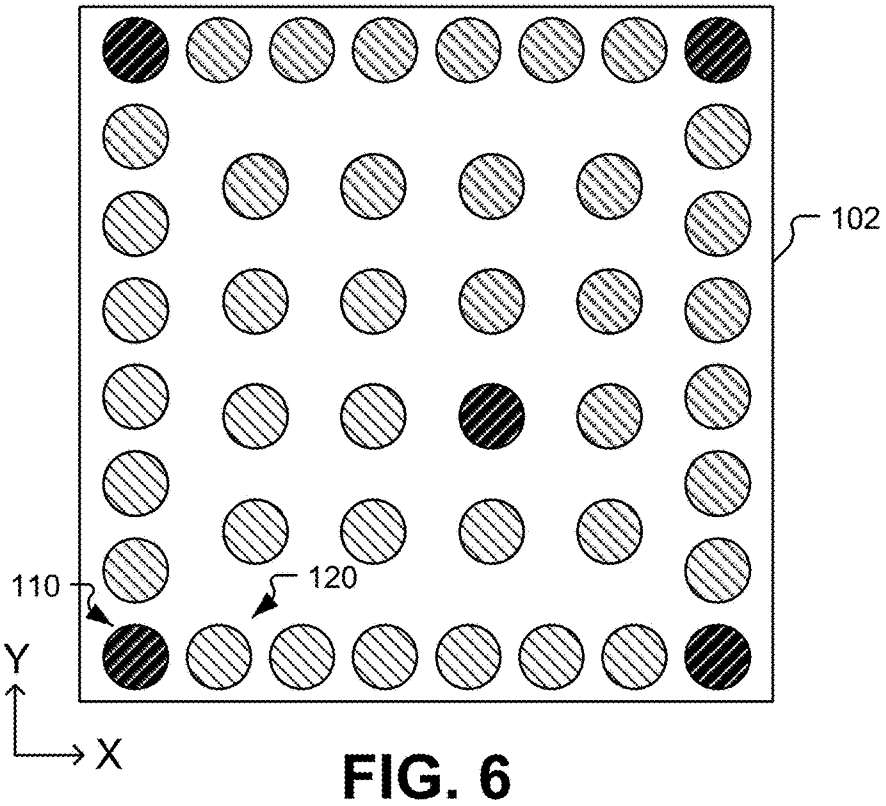
FIG. 6 illustrates a schematic bottom view of another example of the die of FIG. 1.
Figure 7:
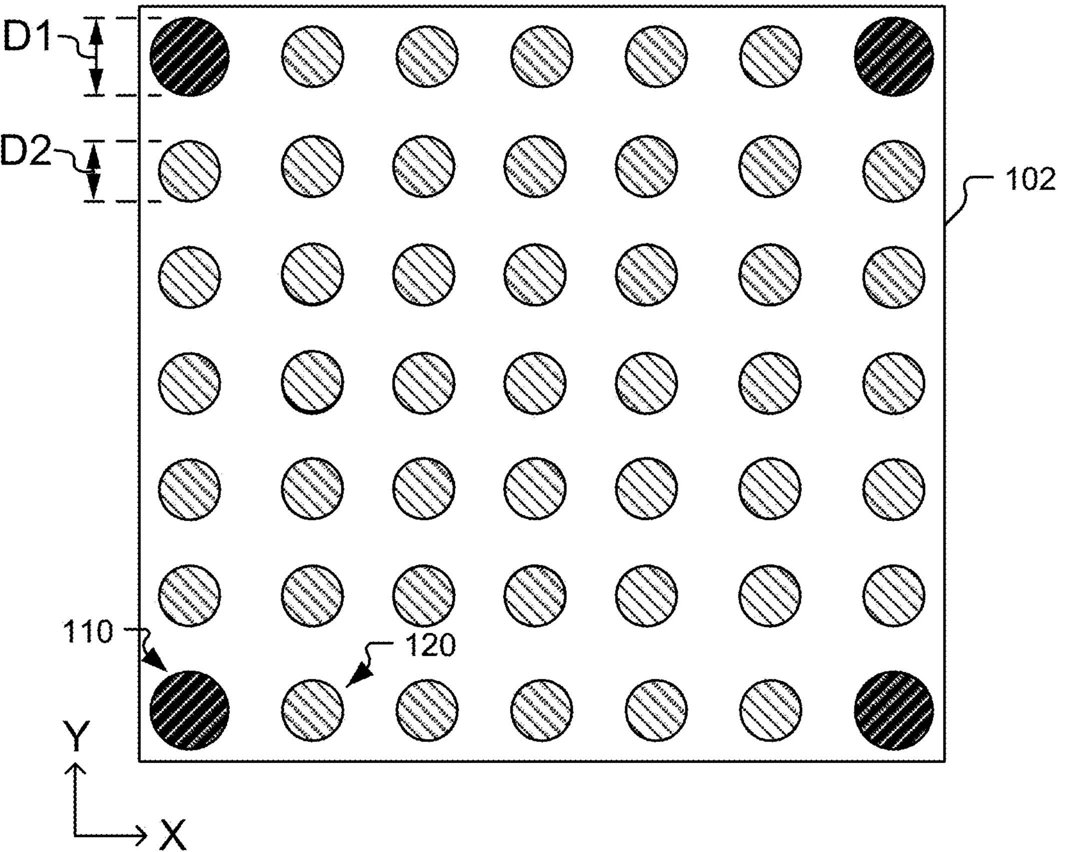
FIG. 7 illustrates a schematic bottom view of another example of the die of FIG. 1.

In FIGS. 6 and 7, corner locations of an array of pillar bumps of the die 102 include pillar bumps 110. Often, corner pillar bumps are subject to higher CPI stresses. In some cases, the CPI stresses can be high enough that the corner pillar bumps are attached to dummy pads so that damage due to CPI stresses at those locations does not impact operation of the die 102. The arrangement illustrated in FIGS. 6 and 7 uses the increased solder cap height of the pillar bumps 110 to reduce the risk of failures at the corner locations due to CPI stresses. As is also illustrated in FIG. 6, in some embodiments, one or more pillar bumps 110 can be disposed at other locations within the array, if needed.

FIG. 7 illustrates an example where the pillar bumps 110 have a first characteristic dimension D1 in the XY plane, and the pillar bumps 120 have a second characteristic dimension D2 in the XY plane. For example, in FIG. 7, the pillar bumps 110 have a larger diameter and a corresponding larger area than the pillar bumps 120. Pillar bumps with larger diameters are generally associated with lower CPI stresses than pillar bumps with small diameters (other factors being equal), accordingly using larger diameter pillar bumps 110 may further limit failure risks associated with CPI stresses.

Figure 8A:
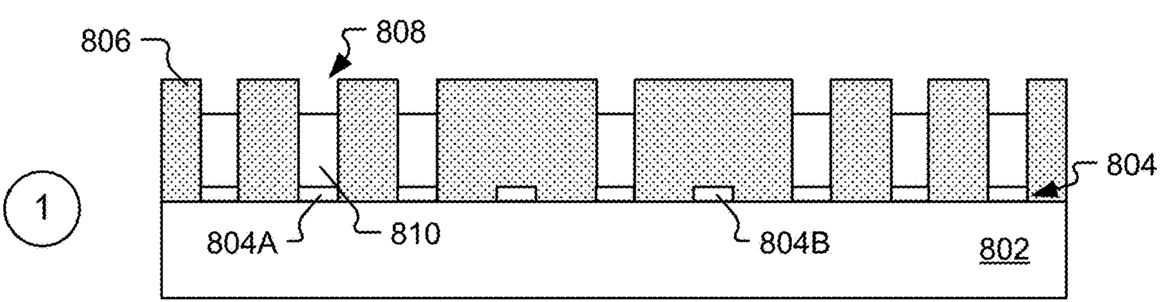
FIGS. 8A and 8B, together, illustrate an exemplary sequence for fabricating an exemplary integrated device.
Figure 8A:
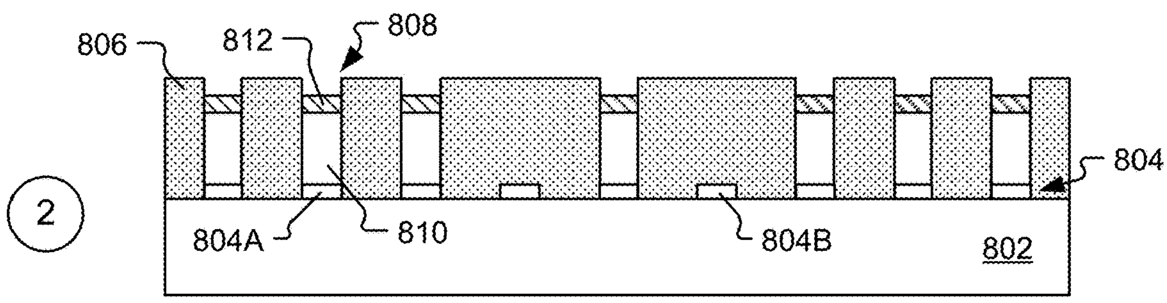
Figure 8A:
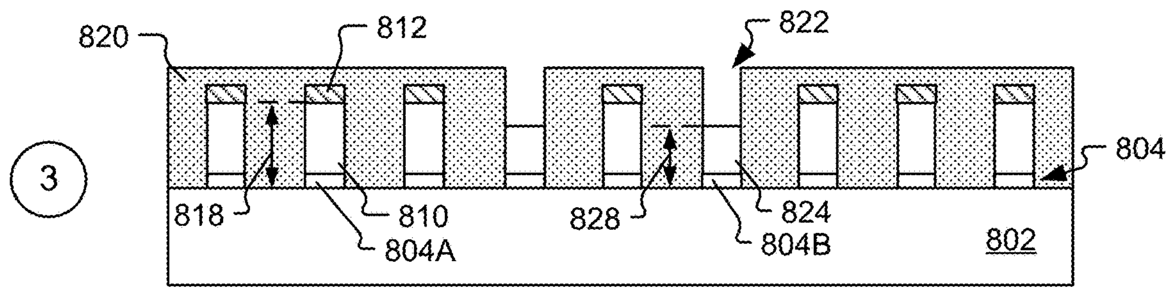
Figure 8A:
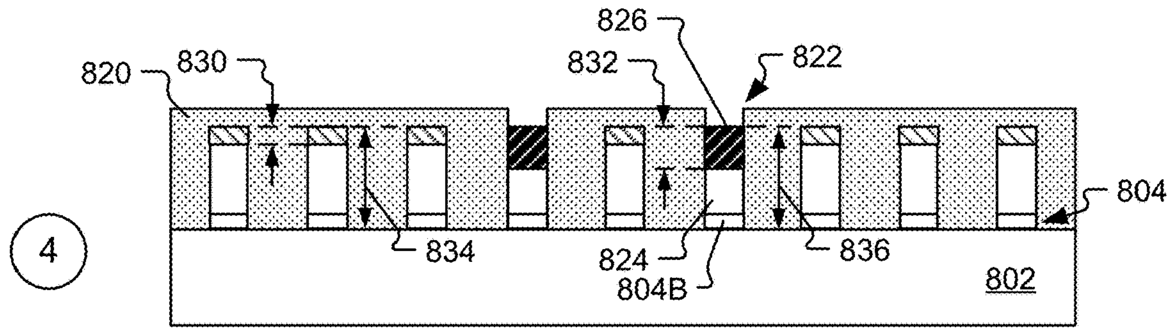
Figure 8B:
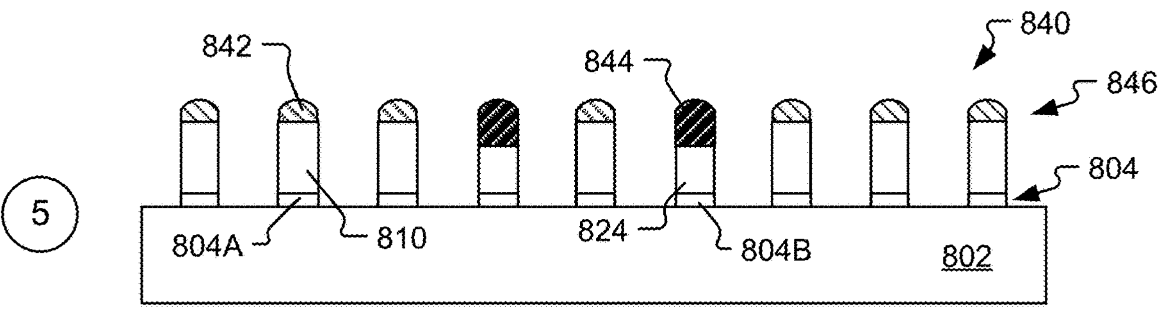
Figure 8B:
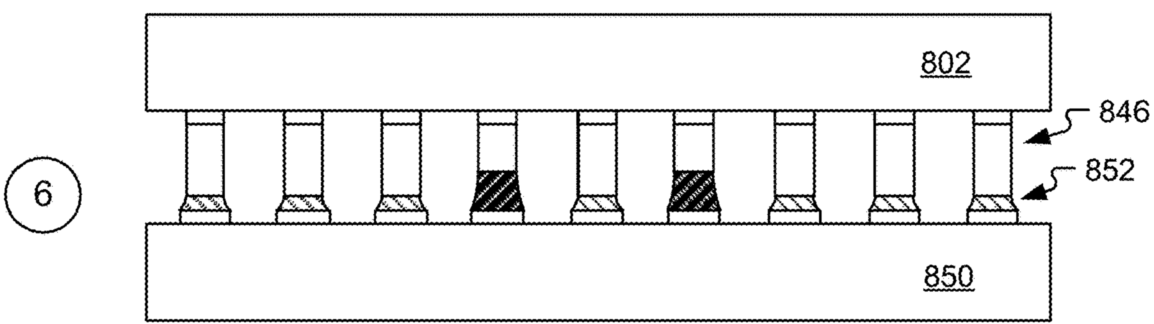
Figure 8B:
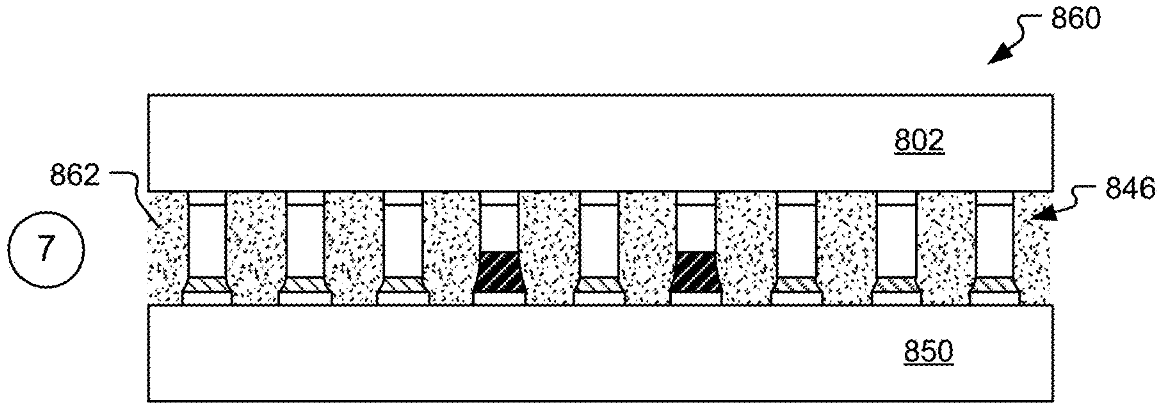

Exemplary Sequence for Fabricating a Device Comprising a Die with Pillar Bumps Having Different Pillar Heights In some implementations, fabricating an integrated device (e.g., the die 102 of any of FIGS. 1-7 or the device 200 of FIG. 2) includes several processes. FIGS. 8A and 8B, together, illustrate an exemplary sequence for fabricating an integrated device. In some implementations, the sequence of FIGS. 8A and 8B may be used to provide (e.g., during fabrication of) one or more of the devices of FIGS. 1-7 (e.g., the die 102 of any of FIGS. 1-7 or the device 200 of FIG. 2).

It should be noted that the sequence of FIGS. 8A and 8B may combine one or more stages in order to simplify and/or clarify the sequence for providing or fabricating an integrated device. In some examples, the order of the processes may be changed or modified. In some examples, one or more of the processes may be replaced or substituted without departing from the scope of the disclosure. In the following description, reference is made to various illustrative stages of the sequence, which are numbered (using circled numbers) in FIGS. 8A and 8B. Each of the various stages of the sequence illustrated in FIGS. 8A and 8B shows a single device being formed. In other implementations, one or more of the stages can be performed in a manner that forms multiple device concurrently (e.g., on a carrier or using operations at a wafer-level, a reconstructed wafer-level, a strip- or panel-level, etc.

Stage 1 of FIG. 8A illustrates a state after formation of a first set of pillars (e.g., representative pillar 810) on one or more contacts 804 (e.g., representative contact 804A) of a die 802. In the example illustrated, formation of the first set of pillars is guided by openings (e.g., representative opening 808) in a resist layer 806. For example, the resist layer 806 can be applied to the die 802 using a spin-on process or another deposition process, and subsequently patterned to form the openings. In this example, patterning the resist layer 806 can include exposing selected portions of the resist layer 806 to light and developing the resist layer 806 to remove portion of the resist layer 806 corresponding to the openings. After processing to form the openings illustrated at Stage 1, a first set of the contacts 804 (e.g., the contact 804A) are exposed by the openings, and a second set of the contacts 804 (e.g., the representative contact 804B) are covered by the resist layer 806 and protected during formation of the first set of pillars.

The first set of pillars can be formed using one or more metal deposition processes, such as electroplating, to deposit a metal, such as copper, on the set of contacts exposed by the openings including, for example, the contact 804A. In some embodiments, each of the contacts 804 includes an under-bump metallization (UBM) layer upon which a respective pillar is formed.

Stage 2 illustrates a state after formation of a solder layer on each pillar of the first set of pillars (formed at Stage 1). For example, a solder layer 812 is formed on the pillar 810. In this example, the opening 808 guides formation of the solder layer 812. The solder layers can be formed using one or more metal deposition processes, such as electroplating, physical vapor deposition, etc. In some embodiments, a barrier layer can be formed on one or more of the pillars of the first set of pillars before a corresponding solder layer is formed. For example, a barrier layer including nickel can be deposited on the pillar 810 before the solder layer 812 is formed.

Stage 3 illustrates a state after removal of the resist layer 806, formation and patterning of a second resist layer 820, and formation of a second set of pillars (e.g., representative pillar 824) on one or more contacts 804 (e.g., representative contact 804B) of the die 802. The resist layer 806 can be removed using one or more ashing, etching, and/or cleaning operations. The second resist layer 820 is formed and patterned using similar processes to those described above with reference to formation and patterning of the resist layer 806. Patterning of the second resist layer 820 defines openings (e.g., representative opening 822) that expose a second set of the contacts 804 (e.g., the representative contact 804B). After patterning, the second resist layer 820 covers the first set of pillars and solder layers.

The second set of pillars are formed using similar processes to those described above with reference to formation of the first set of pillars. As illustrated in FIG. 8A, a pillar height 828 of the second set of pillars is different from a pillar height 818 of the first set of pillars. In the specific example depicted in FIGS. 8A and 8B, the first pillar height 818 is greater than the pillar height 828; however, this is merely illustrative and could be reversed in some embodiments. Further, because the first and second sets of pillars are formed separately, the first and second sets of pillars can be formed using the same processes or different processes. For example, the chemical composition of the pillar 810 can be the same as or different from the chemical composition of the pillar 824. As another example, the pillar 810 can include a barrier layer that is omitted from the pillar 824, or vice versa. The first and second sets of pillars can also, or alternatively, differ in other respects, such as in a shape or size (e.g., characteristic dimension) along a plane orthogonal to the view illustrated in FIGS. 8A and 8B.

Stage 4 illustrates a state after formation of a solder layer on each pillar of the second set of pillars (formed at Stage 3). For example, a solder layer 826 is formed on the pillar 824. The solder layers on the second set of pillars are formed using similar processes to those described above with reference to formation of the solder layers on the first set of pillars, although different solder compositions can be used in some embodiments. As illustrated in FIG. 8A, a solder layer height 832 on the second set of pillars is different from a solder layer height 830 on the first set of pillars. In particular, the solder layer height 832 and the solder layer height 830 are selected such that a total height 836 including the pillar height 828 and the solder layer height 832 is substantially equal to a total height 834 including the pillar height 818 and the solder layer height 830.

Stage 5 of FIG. 8B illustrates a state after removal of the second resist layer 820 and heating to reflow the solder layers to form solder caps (including representative solder caps 842 and 844). Processing to form a device 840 that includes a die 802 including a set of pillar bumps 846 including pillars of different pillar heights and solder caps of different solder cap heights is complete at Stage 5. For example, the device 840 may correspond to or include the die 102 with the pillar bumps 104 of any of FIGS. 1-7.

Stage 6 illustrates a state after die attach operations to electrically connect the pillar bumps 846 to contacts 852 of a substrate 850. For example, the pillar bumps 846 can be coupled to the contacts 852 via application of heat (e.g., reflow operations) or heat and pressure (e.g., thermal compression bonding operations). As explained above, the different solder cap heights of the pillar bumps 846 enable close packing of the pillar bumps 846 with limited risk of solder bridging because the shorter solder caps (e.g., representative solder cap 842) support taller solder caps (e.g., representative solder cap 844) to limit spreading of the taller solder caps. Further, the taller solder caps reduce the risk of failures due to CPI stresses since the solder buffers transfer of some of the CPI stresses to more fragile layers, such as low-k dielectric layers.

Stage 7 illustrates a state after application of a fill material 862 in a region between the die 802 and the substrate 850. In the example illustrated, the fill material 862 is applied after the die attach operations described with reference to Stage 6. To limit risk of voids, the fill material 862 can include a low viscosity material that is driven by capillary action to fill the region between the die 802 and the substrate 850. After the region between the die 802 and the substrate 850 is filled, the fill material 862 is cured to form a bond to the die 802, the substrate 850, and the pillar bumps 846. In other examples, the fill material 862 can be applied before the die attach operations described with reference to Stage 6, in which case, a higher viscosity fill material is used. Formation of an integrated device 860 that includes a die 802 having pillar bumps 846 with at least two different pillar heights attached to a substrate 850 is complete at Stage 7. For example, the integrated device 860 may correspond to or include the device 200 of FIG. 2.

Although FIGS. 8A and 8B illustrate operations to form pillar bumps 846 with two different pillar heights (e.g., pillar heights 818 and 828), the operations can be extended to form pillar bumps 846 with more than two different pillar heights. For example, the operations described with reference to Stages 1-4 can be repeated one or more additional times to form pillar bumps with three or more different pillar heights. The example illustrated in FIGS. 8A and 8B focuses on formation of the pillar bumps and using the pillar bumps to connect a die to a substrate and omit many other operations that may be performed to form the final integrated device. For example, other devices or components can be coupled to the substrate and electrically connected to the die 802 via the pillar bumps 846. Further, the substrate 850 can correspond to another die, an interposer device, a laminate substrate, or another device.

Figure 9:
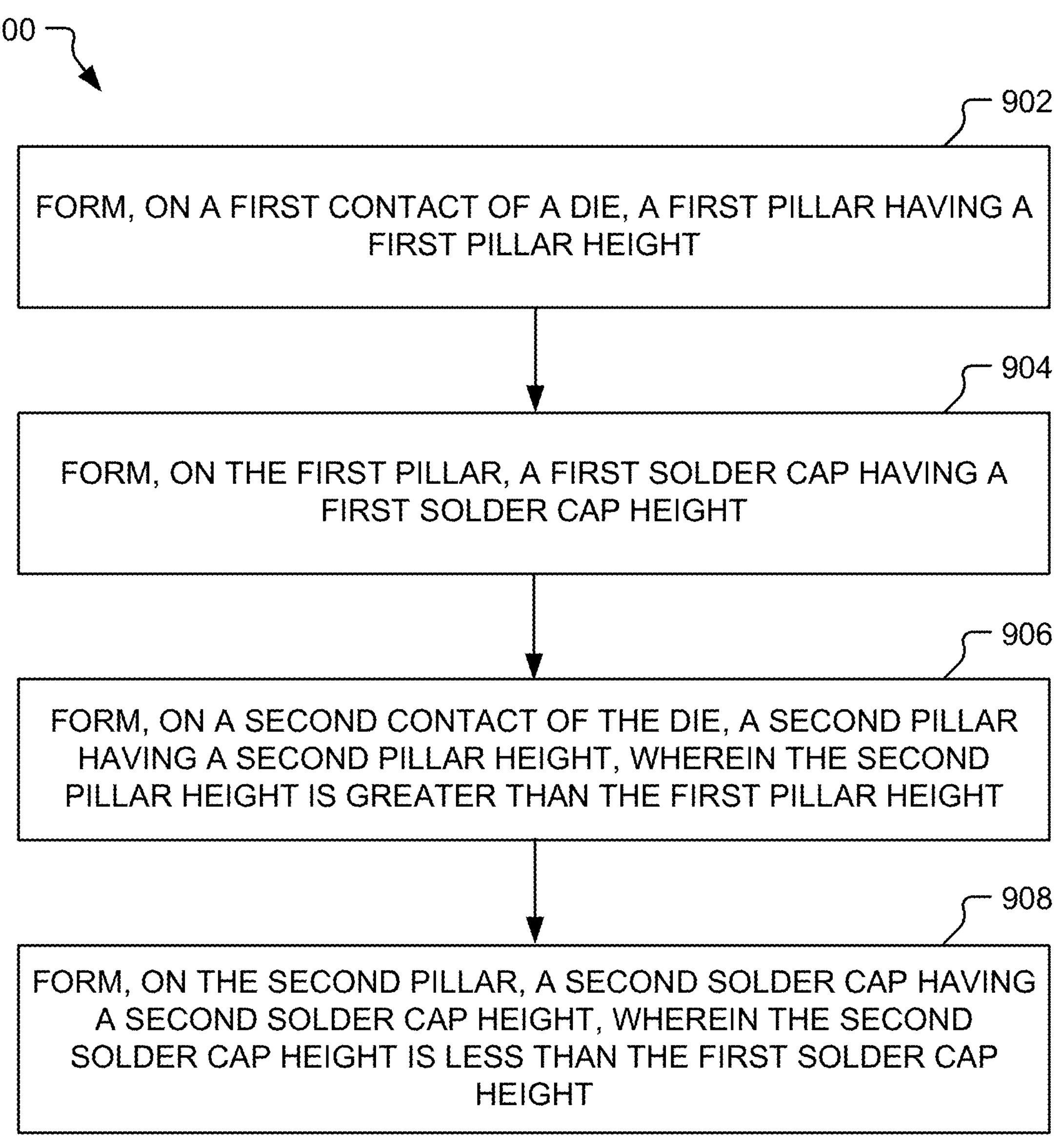
FIG. 9 illustrates an exemplary flow diagram of a method for fabricating a die with a set of pillar bumps including pillars of different pillar heights and solder caps of different solder cap heights.

Exemplary Flow Diagram of a Method for Fabricating a Device Comprising a Die with Pillar Bumps Having Different Pillar Heights FIG. 9 illustrates an exemplary flow diagram of a method 900 for fabricating a die with a set of pillar bumps including pillars of different pillar heights and solder caps of different solder cap heights. For example, the method 900 can be used to form the die 102 of FIG. 1, which includes the pillar bumps 110 and the pillar bumps 120.

The method 900 includes, at block 902, forming, on a first contact of a die, a first pillar having a first pillar height. For example, the first pillar can be formed via deposition of metal as guided by a patterned resist layer. Exemplary operations to form the patterned resist layer and to deposit metal to form pillars in openings of the patterned resist layer are described with reference to Stage 1 of FIG. 8A.

The method 900 includes, at block 904, forming, on the first pillar, a first solder cap having a first solder cap height. For example, the first solder cap can correspond to or include a solder layer deposited on the first pillar, which can subsequently be shaped via heating. In this example, deposition of the solder layer can be guided by the same patterned resist as was used to guide formation of the first pillar. Exemplary operations to form the solder layer are described with reference to Stage 2 of FIG. 8A, and operations to shape the solder layer to form a solder cap are described with reference to Stage 5 of FIG. 8B.

The method 900 includes, at block 906, forming, on a second contact of the die, a second pillar having a second pillar height, where the second pillar height is greater than the first pillar height. For example, the second pillar can be formed via deposition of metal as guided by a second patterned resist layer. Exemplary operations to form the second patterned resist layer and to deposit metal to form pillars in openings of the second patterned resist layer are described with reference to Stage 3 of FIG. 8A.

The method 900 includes, at block 908, forming, on the second pillar, a second solder cap having a second solder cap height, where the second solder cap height is less than the first solder cap height. For example, the second solder cap can correspond to or include a second solder layer deposited on the second pillar, which can subsequently be shaped via heating. In this example, deposition of the second solder layer can be guided by the second patterned resist. Exemplary operations to form the second solder layer are described with reference to Stage 4 of FIG. 8A, and operations to shape the second solder layer to form a solder cap are described with reference to Stage 5 of FIG. 8B.

In some embodiments, the method 900 also includes forming a barrier layer between one of the pillars and its respective solder cap. For example, the method 900 can include, before forming the first solder cap, forming a first barrier layer on the first pillar. Additionally, or alternatively, the method 900 can include, before forming the second solder cap, forming a second barrier layer on the second pillar. Formation of a barrier layer on a pillar can be guided by the same patterned resist layer used to guide formation of the pillar.

In some embodiments, the method 900 can be used to form solder caps with different chemical compositions. For example, forming the first solder cap can include performing first solder deposition operations to deposit a first metal or alloy, and forming the second solder cap can include performing second solder deposition operations to deposit a second metal or alloy different from the first metal or alloy.

In some embodiments, the method 900 can be used to form pillar bumps with different cross-sectional shapes, sizes, or both. For example, the first pillar bump can be formed with a first characteristic dimension along a direction orthogonal to the first pillar height, and the second pillar bump can be formed with a second characteristic dimension along the direction, where the first characteristic dimension is greater than the second characteristic dimension. As another example, the first pillar bump can be formed with a first cross-sectional shape in a plane orthogonal to the first pillar height, and the second pillar bump can be formed with a second cross-sectional shape in the plane, and where the first cross-sectional shape is different from the second cross-sectional shape.

Figure 10:
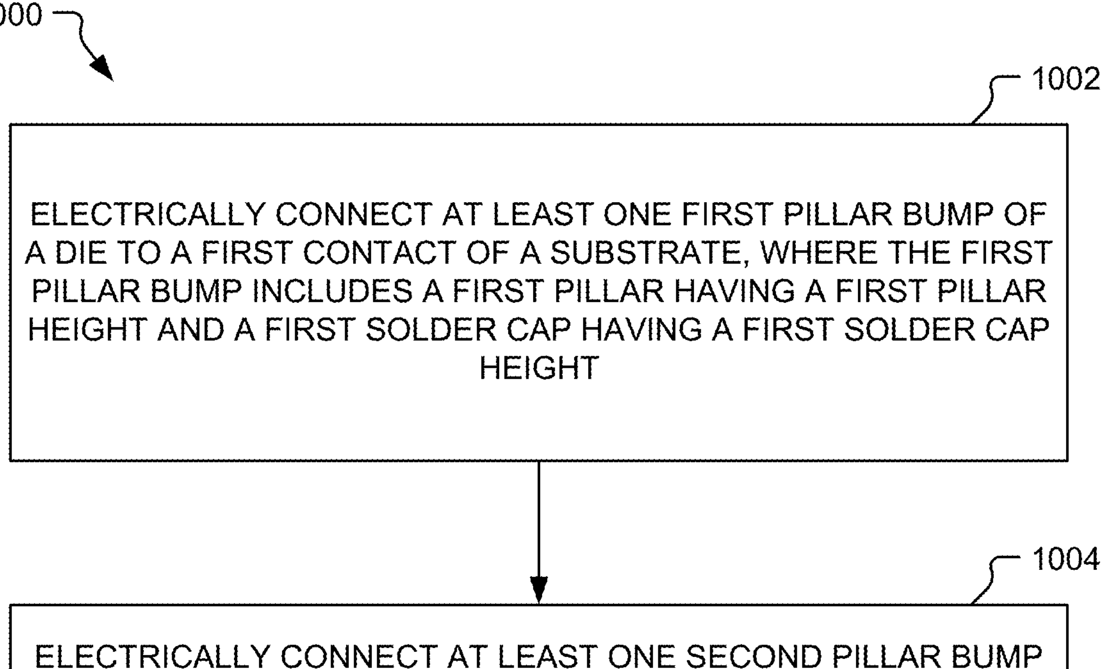
FIG. 10 illustrates an exemplary flow diagram of a method for fabricating the integrated device that includes a die with a set of pillar bumps including pillars of different pillar heights and solder caps of different solder cap heights.

FIG. 10 illustrates an exemplary flow diagram of a method for fabricating the integrated device that includes a die with a set of pillar bumps including pillars of different pillar heights and solder caps of different solder cap heights. For example, the method 1000 can be used to form the device 200, which includes the die 102 coupled to the substrate 202 by the pillar bumps 110 and the pillar bumps 120.

The method 1000 includes, at block 1002, electrically connecting at least one first pillar bump of a die to a first contact of a substrate, where the first pillar bump includes a first pillar having a first pillar height and a first solder cap having a first solder cap height. For example, the pillar bump 110, which includes the pillar 112 and the solder cap 114 can be electrically connected to the contact 210 of the substrate 202.

The method 1000 also includes, at block 1004, electrically connecting at least one second pillar bump of the die to a second contact of the substrate, where the second pillar bump includes a second pillar having a second pillar height and a second solder cap having a second solder cap height. For example, the pillar bump 120, which includes the pillar 122 and the solder cap 124 can be electrically connected to one of the contacts 204 of the substrate 202. The solder cap heights and pillar heights of the pillar bumps can be different. In this example, the second pillar height can be greater than the first pillar height, and the second solder cap height can be less than the first solder cap height. However, in other examples, the second pillar height can be less than the first pillar height, and the second solder cap height can be greater than the first solder cap height.

In some embodiments, the method 1000 includes electrically connecting at least one first pillar bump (e.g., a pillar bump with a shorter pillar and a taller solder cap) in a core region of the die to core contacts of the substrate. In such embodiments, the method 1000 can also include electrically connecting at least one second pillar bump (e.g., a pillar bump with a taller pillar and a shorter solder cap) in a periphery region of the dic to periphery contacts of the substrate. FIGS. 1-5 illustrate examples of such embodiments.

In some embodiments, the method 1000 includes electrically connecting a plurality of first pillar bumps to a respective plurality of first contacts of the substrate and electrically connecting a plurality of second pillar bumps to a respective plurality of second contacts of the substrate, and where the first contacts are at locations associated with higher CPI stresses than the second contacts. For example, the first contacts can be associated with via-in-pad structures, with corners of the die, or with other locations that have been identified as associated with higher CPI stresses by data associated with the integrated device. To illustrate, in some embodiments, the method 1000 includes electrically connecting a plurality of first pillar bumps to a respective plurality of first contacts of the substrate and electrically connecting a plurality of second pillar bumps to a respective plurality of second contacts of the substrate, and where the first contacts are at locations of via-in-pad structures of the substrate.

In some embodiments, the method 1000 includes disposing a fill material in a region between the die and the substrate. For example, the fill material 862 of FIG. 8B can be disposed in the region between the die 802 and the substrate 850, as described with reference to Stage 7 of FIG. 8B.

In addition to having different pillar heights and solder cap heights, the first and second pillar bumps can differ in other respects. For example, the first pillar bump can have a first characteristic dimension along a direction orthogonal to the first pillar height, and the second pillar bump can have a second characteristic dimension along the direction, where the first characteristic dimension is greater than the second characteristic dimension. As another example, the first pillar bump can have a first cross-sectional shape in a plane orthogonal to the first pillar height, and the second pillar bump can have a second cross-sectional shape in the plane, and where the first cross-sectional shape is different from the second cross-sectional shape.

Exemplary Electronic Devices

Figure 11:
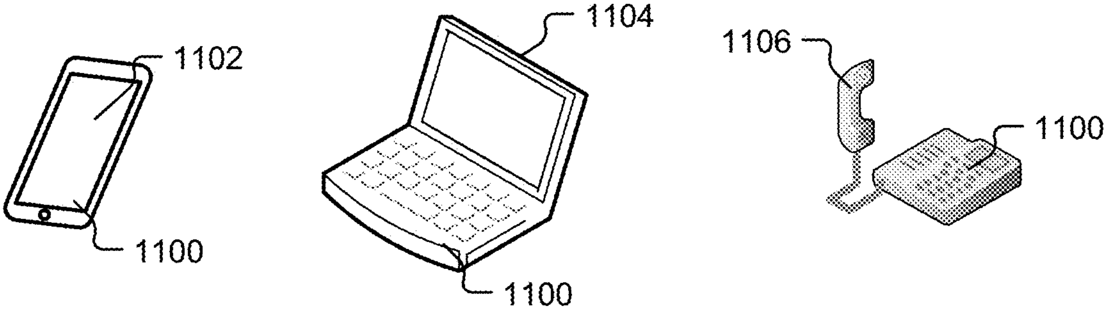
FIG. 11 illustrates various electronic devices that may integrate a die, an electronic circuit, an integrated device, an integrated passive device (IPD), a passive component, a package, and/or a device package described herein.
Figure 11:
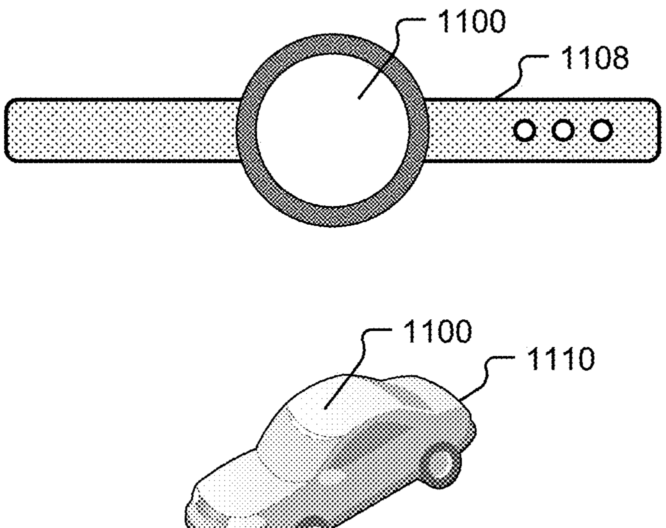

FIG. 11 illustrates various electronic devices that may include or be integrated with the die 102 of any of FIGS. 1-7, the device 200 of FIG. 2, or the device 840 or 860 of FIG. 8B. For example, a mobile phone device 1102, a laptop computer device 1104, a fixed location terminal device 1106, a wearable device 1108, or a vehicle 1110 (e.g., an automobile or an aerial device) may include a device 1100. The device 1100 can include, for example, the die 102 that includes the pillar bumps 104, the device 200 that includes the die 102, the device 840 which includes the die 802 and the pillar bumps 846, or the device 860 that includes the device 840 described herein. The devices 1102, 1104, 1106 and 1108 and the vehicle 1110 illustrated in FIG. 11 are merely exemplary. Other electronic devices may also feature the device 1100 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices (e.g., watches, glasses), Internet of things (IoT) devices, servers, routers, electronic devices implemented in vehicles (e.g., autonomous vehicles), or any other device that stores or retrieves data or computer instructions, or any combination thereof.

One or more of the components, processes, features, and/or functions illustrated in FIGS. 1-11 may be rearranged and/or combined into a single component, process, feature or function or embodied in several components, processes, or functions. Additional elements, components, processes, and/or functions may also be added without departing from the disclosure. It should also be noted FIGS. 1-11 and its corresponding description in the present disclosure is not limited to dies and/or ICs. In some implementations, FIGS. 1-11 and the corresponding description may be used to manufacture, create, provide, and/or produce devices and/or integrated devices. In some implementations, a device may include a die, an integrated device, an integrated passive device (IPD), a die package, an integrated circuit (IC) device, a device package, an integrated circuit (IC) package, a wafer, a semiconductor device, a package-on-package (POP) device, a heat dissipating device and/or an interposer.

It is noted that the figures in the disclosure may represent actual representations and/or conceptual representations of various parts, components, objects, devices, packages, integrated devices, integrated circuits, and/or transistors. In some instances, the figures may not be to scale. In some instances, for purpose of clarity, not all components and/or parts may be shown. In some instances, the position, the location, the sizes, and/or the shapes of various parts and/or components in the figures may be exemplary. In some implementations, various components and/or parts in the figures may be optional.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling (e.g., mechanical coupling) between two objects. For example, if object A physically touches object B, and object B touches object C, then objects A and C may still be considered coupled to one another-even if they do not directly physically touch each other. An object A, that is coupled to an object B, may be coupled to at least part of object B. The term "electrically coupled" may mean that two objects are directly or indirectly coupled together such that an electrical current (e.g., signal, power, ground) may travel between the two objects. Two objects that are electrically coupled may or may not have an electrical current traveling between the two objects. The use of the terms "first", "second", "third" and "fourth" (and/or anything above fourth) is arbitrary. Any of the components described may be the first component, the second component, the third component or the fourth component. For example, a component that is referred to as a second component, may be the first component, the second component, the third component or the fourth component. The terms "encapsulate", "encapsulating" and/or any derivation means that the object may partially encapsulate or completely encapsulate another object. The terms "top" and "bottom" are arbitrary. A component that is located on top may be located over a component that is located on a bottom. A top component may be considered a bottom component, and vice versa. As described in the disclosure, a first component that is located "over" a second component may mean that the first component is located above or below the second component, depending on how a bottom or top is arbitrarily defined. In another example, a first component may be located over (e.g., above) a first surface of the second component, and a third component may be located over (e.g., below) a second surface of the second component, where the second surface is opposite to the first surface. It is further noted that the term "over" as used in the present application in the context of one component located over another component, may be used to mean a component that is on another component and/or in another component (e.g., on a surface of a component or embedded in a component). Thus, for example, a first component that is over the second component may mean that (1) the first component is over the second component, but not directly touching the second component, (2) the first component is on (e.g., on a surface of) the second component, and/or (3) the first component is in (e.g., embedded in) the second component. A first component that is located "in" a second component may be partially located in the second component or completely located in the second component. A value that is about X-XX, may mean a value that is between X and XX, inclusive of X and XX. The value(s) between X and XX may be discrete or continuous. The term "about 'value X'", or "approximately value X", as used in the disclosure means within 10 percent of the 'value X'. For example, a value of about 1 or approximately 1, would mean a value in a range of 0.9-1.1. A "plurality" of components may include all the possible components or only some of the components from all of the possible components. For example, if a device includes ten components, the use of the term "the plurality of components" may refer to all ten components or only some of the components from the ten components.

In some implementations, an interconnect is an element or component of a device or package that allows or facilitates an electrical connection between two points, elements and/or components. In some implementations, an interconnect may include a trace, a via, a pad, a pillar, a metallization layer, a redistribution layer, and/or an under-bump metallization (UBM) layer/interconnect. In some implementations, an interconnect may include an electrically conductive material that may be configured to provide an electrical path for a signal (e.g., a data signal), ground and/or power. An interconnect may include more than one element or component. An interconnect may be defined by one or more interconnects. An interconnect may include one or more metal layers. An interconnect may be part of a circuit. Different implementations may use different processes and/or sequences for forming the interconnects. In some implementations, a chemical vapor deposition (CVD) process, a physical vapor deposition (PVD) process, a sputtering process, a spray coating, and/or a plating process may be used to form the interconnects.

Also, it is noted that various disclosures contained herein may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

In the following, further examples are described to facilitate the understanding of the disclosure.

According to Example 1, a device includes a die that includes a plurality of pillar bumps configured to electrically connect the die to a substrate. The plurality of pillar bumps includes at least one first pillar bump having a first total pillar bump height. The at least one first pillar bump includes a first pillar having a first pillar height and a first solder cap having a first solder cap height. The plurality of pillar bumps includes at least one second pillar bump having a second pillar height substantially equal to the first total pillar bump height. The at least one second pillar bump includes a second pillar having a second pillar height, where the second pillar height is greater than the first pillar height. The at least one second pillar bump also includes a second solder cap having a second solder cap height, where the second solder cap height is less than the first solder cap height.

Example 2 includes the device of Example 1, wherein at least one pillar bump of the plurality of pillar bumps includes a barrier layer between a pillar of the at least one pillar bump and a solder cap of the at least one pillar bump.

Example 3 includes the device of Example 1 or Example 2, wherein the first solder cap comprises a first metal or alloy, and the second solder cap comprises a second metal or alloy different from the first metal or alloy.

Example 4 includes the device of any of Examples 1 to 3, wherein the first pillar comprises a first metal or alloy, and the second pillar comprises a second metal or alloy different from the first metal or alloy.

Example 5 includes the device of any of Examples 1 to 4, wherein the plurality of pillar bumps comprises a plurality of first pillar bumps and a plurality of second pillar bumps.

Example 6 includes the device of Example 5, wherein the plurality of first pillar bumps are disposed in a core region of a surface of the die, and the plurality of second pillar bumps are disposed in a periphery region of the surface.

Example 7 includes the device of Example 5 or Example 6, wherein the plurality of first pillar bumps are disposed at first locations, and the plurality of second pillar bumps are disposed at second locations, and wherein the first locations are associated with higher chip-package interaction (CPI) stresses than the second locations.

Example 8 includes the device of Example 5 to 7, wherein the plurality of first pillar bumps are disposed at first locations, and the plurality of second pillar bumps are disposed at second locations, and wherein the first locations correspond to locations of via-in-pad structures of the substrate.

Example 9 includes the device of any of Examples 1 to 8 and further includes the substrate and a fill material disposed in a region between the die and the substrate.

Example 10 includes the device of any of Examples 1 to 9, wherein the at least one first pillar bump has a first characteristic dimension along a direction orthogonal to the first pillar height, and the at least one second pillar bump has a second characteristic dimension along the direction, and wherein the first characteristic dimension is greater than the second characteristic dimension.

Example 11 includes the device of any of Examples 1 to 10, wherein the at least one first pillar bump has a first cross-sectional shape in a plane orthogonal to the first pillar height, and the at least one second pillar bump has a second cross-sectional shape in the plane, and wherein the first cross-sectional shape is different from the second cross-sectional shape.

According to Example 12, an integrated device includes a substrate comprising a plurality of contacts. The integrated device also includes a die that includes integrated circuitry electrically connected to the plurality of contacts via a plurality of pillar bumps. The plurality of pillar bumps includes at least one first pillar bump including a first pillar having a first pillar height and a first solder cap having a first solder cap height. The plurality of pillar bumps also includes at least one second pillar bump. The at least one second pillar bump includes a second pillar having a second pillar height, where the second pillar height is greater than the first pillar height. The at least one second pillar bump also includes a second solder cap having a second solder cap height, where the second solder cap height is less than the first solder cap height.

Example 13 includes the integrated device of Example 12, wherein at least one pillar bump of the plurality of pillar bumps comprises a barrier layer between a pillar of the at least one pillar bump and a solder cap of the at least one pillar bump.

Example 14 includes the integrated device of Example 12 or Example 13, wherein the first solder cap comprises a first metal or alloy, and the second solder cap comprises a second metal or alloy different from the first metal or alloy.

Example 15 includes the integrated device of any of Examples 12 to 14, wherein the first pillar comprises a first metal or alloy, and the second pillar comprises a second metal or alloy different from the first metal or alloy.

Example 16 includes the integrated device of any of Examples 12 to 15, wherein the plurality of pillar bumps comprises a plurality of first pillar bumps and a plurality of second pillar bumps.

Example 17 includes the integrated device of Example 16, wherein the plurality of first pillar bumps are disposed in a core region of an interface between the die and the substrate, and the plurality of second pillar bumps are disposed in a periphery region of the interface.

Example 18 includes the integrated device of Example 16, wherein the plurality of first pillar bumps are disposed at first locations, and the plurality of second pillar bumps are disposed at second locations, and wherein the first locations are associated with higher chip-package interaction (CPI) stresses than the second locations.

Example 19 includes the integrated device of Example 16, wherein the plurality of first pillar bumps are disposed at first locations, and the plurality of second pillar bumps are disposed at second locations, and wherein the first locations correspond to locations of via-in-pad structures of the substrate.

Example 20 includes the integrated device of any of Examples 12 to 19 and further includes a fill material disposed in a region between the die and the substrate.

Example 21 includes the integrated device of any of Examples 12 to 20, wherein the at least one first pillar bump has a first characteristic dimension along a direction orthogonal to the first pillar height, and the at least one second pillar bump has a second characteristic dimension along the direction, and wherein the first characteristic dimension is greater than the second characteristic dimension.

Example 22 includes the integrated device of any of Examples 12 to 21, wherein the at least one first pillar bump has a first cross-sectional shape in a plane orthogonal to the first pillar height, and the at least one second pillar bump has a second cross-sectional shape in the plane, and wherein the first cross-sectional shape is different from the second cross-sectional shape.

According to Example 23, a method for fabricating an integrated device includes electrically connecting at least one first pillar bump of a die to a first contact of a substrate, wherein the first pillar bump includes a first pillar having a first pillar height and a first solder cap having a first solder cap height. The method also includes electrically connecting at least one second pillar bump of the die to a second contact of the substrate, wherein the second pillar bump includes a second pillar having a second pillar height and a second solder cap having a second solder cap height. The second pillar height is greater than the first pillar height, and the second solder cap height is less than the first solder cap height.

Example 24 includes the method of Example 23, wherein electrically connecting the at least one first pillar bump of the die to the first contact of the substrate includes electrically connecting a plurality of first pillar bumps disposed in a core region of the die to core contacts of the substrate, and wherein electrically connecting the at least one second pillar bump of the die to the second contact of the substrate includes electrically connecting a plurality of second pillar bumps disposed in a periphery region of the die to periphery contacts of the substrate.

Example 25 includes the method of Example 23, wherein electrically connecting the at least one first pillar bump of the die to the first contact of the substrate includes electrically connecting a plurality of first pillar bumps to a respective plurality of first contacts of the substrate, wherein electrically connecting the at least one second pillar bump of the die to the second contact of the substrate includes electrically connecting a plurality of second pillar bumps to a respective plurality of second contacts of the substrate, and wherein the first contacts are at locations associated with higher chip-package interaction (CPI) stresses than the second contacts.

Example 26 includes the method of Example 23, wherein electrically connecting the at least one first pillar bump of the die to the first contact of the substrate includes electrically connecting a plurality of first pillar bumps to a respective plurality of first contacts of the substrate, wherein electrically connecting the at least one second pillar bump of the die to the second contact of the substrate includes electrically connecting a plurality of second pillar bumps to a respective plurality of second contacts of the substrate, and wherein the first contacts are at locations of via-in-pad structures of the substrate.

Example 27 includes the method of any of Examples 23 to 26 and further includes disposing a fill material in a region between the die and the substrate.

Example 28 includes the method of any of Examples 23 to 27, wherein the at least one first pillar bump has a first characteristic dimension along a direction orthogonal to the first pillar height, and the at least one second pillar bump has a second characteristic dimension along the direction, and wherein the first characteristic dimension is greater than the second characteristic dimension.

Example 29 includes the method of any of Examples 23 to 28, wherein the at least one first pillar bump has a first cross-sectional shape in a plane orthogonal to the first pillar height and the at least one second pillar bump has a second cross-sectional shape in the plane, and wherein the first cross-sectional shape is different from the second cross-sectional shape.

According to Example 30, a method for fabricating an integrated device includes forming, on a first contact of a die, a first pillar having a first pillar height. The method also includes forming, on the first pillar, a first solder cap having a first solder cap height. The method also includes forming, on a second contact of the die, a second pillar having a second pillar height, wherein the second pillar height is greater than the first pillar height. The method also includes forming, on the second pillar, a second solder cap having a second solder cap height, wherein the second solder cap height is less than the first solder cap height.

Example 31 includes the method of Example 30, further includes, before forming the first solder cap, forming a first barrier layer on the first pillar, and before forming the second solder cap, forming a second barrier layer on the second pillar.

Example 32 includes the method of Example 30 or Example 31, wherein forming the first solder cap comprises performing first solder deposition operations to deposit a first metal or alloy, and forming the second solder cap comprises performing second solder deposition operations to deposit a second metal or alloy different from the first metal or alloy.

Example 33 includes the method of any of Examples 30 to 32, wherein the first pillar bump is formed with a first characteristic dimension along a direction orthogonal to the first pillar height, and the second pillar bump is formed with a second characteristic dimension along the direction, and wherein the first characteristic dimension is greater than the second characteristic dimension.

Example 34 includes the method of any of Examples 30 to 33, wherein the first pillar bump is formed with a first cross-sectional shape in a plane orthogonal to the first pillar height, and the second pillar bump is formed with a second cross-sectional shape in the plane, and wherein the first cross-sectional shape is different from the second cross-sectional shape.

The various features of the disclosure described herein can be implemented in different systems without departing from the disclosure. It should be noted that the foregoing aspects of the disclosure are merely examples and are not to be construed as limiting the disclosure. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

The invention claimed is:

1. A device comprising:

a die comprising:

a plurality of pillar bumps configured to electrically connect the die to a substrate, the plurality of pillar bumps including:

at least one first pillar bump having a first total pillar bump height, the at least one first pillar bump comprising:

a first pillar having a first pillar height; and a first solder cap having a first solder cap height; and at least one second pillar bump having a second total pillar bump height substantially equal to the first total pillar bump height, the at least one second pillar bump comprising:

a second pillar having a second pillar height, wherein the second pillar height is greater than the first pillar height; and a second solder cap having a second solder cap height, wherein the second solder cap height is less than the first solder cap height; and a fill material disposed in a region between the die and the substrate.

2. The device of claim 1, wherein at least one pillar bump of the plurality of pillar bumps comprises a barrier layer between a pillar of the at least one pillar bump and a solder cap of the at least one pillar bump.

3. The device of claim 1, wherein the first solder cap comprises a first metal or alloy and the second solder cap comprises a second metal or alloy different from the first metal or alloy.

4. The device of claim 1, wherein the first pillar comprises a first metal or alloy and the second pillar comprises a second metal or alloy different from the first metal or alloy.

5. The device of claim 1, wherein the plurality of pillar bumps comprises a plurality of first pillar bumps and a plurality of second pillar bumps.

6. The device of claim 5, wherein the plurality of first pillar bumps are disposed in a core region of a surface of the die and the plurality of second pillar bumps are disposed in a periphery region of the surface.

7. The device of claim 5, wherein the plurality of first pillar bumps are disposed at first locations and the plurality of second pillar bumps are disposed at second locations, and wherein the first locations are associated with higher chip-package interaction (CPI) stresses than the second locations.

8. The device of claim 5, wherein the plurality of first pillar bumps are disposed at first locations and the plurality of second pillar bumps are disposed at second locations, and wherein the first locations correspond to locations of via-in-pad structures of the substrate.

9. The device of claim 1, wherein the at least one first pillar bump has a first characteristic dimension along a direction orthogonal to the first pillar height and the at least one second pillar bump has a second characteristic dimension along the direction, and wherein the first characteristic dimension is greater than the second characteristic dimension.

10. The device of claim 1, wherein the at least one first pillar bump has a first cross-sectional shape in a plane orthogonal to the first pillar height and the at least one second pillar bump has a second cross-sectional shape in the plane, and wherein the first cross-sectional shape is different from the second cross-sectional shape.

11. An integrated device comprising:

a substrate comprising a plurality of contacts;

a die comprising integrated circuitry electrically connected to the plurality of contacts via a plurality of pillar bumps, the plurality of pillar bumps comprising:

at least one first pillar bump including:

a first pillar having a first pillar height; and a first solder cap having a first solder cap height; and at least one second pillar bump including:

a second pillar having a second pillar height, wherein the second pillar height is greater than the first pillar height; and a second solder cap having a second solder cap height, wherein the second solder cap height is less than the first solder cap height; and a fill material disposed in a region between the die and the substrate.

12. The integrated device of claim 11, wherein at least one pillar bump of the plurality of pillar bumps comprises a barrier layer between a pillar of the at least one pillar bump and a solder cap of the at least one pillar bump.

13. The integrated device of claim 11, wherein the first solder cap comprises a first metal or alloy and the second solder cap comprises a second metal or alloy different from the first metal or alloy.

14. The integrated device of claim 11, wherein the first pillar comprises a first metal or alloy and the second pillar comprises a second metal or alloy different from the first metal or alloy.

15. The integrated device of claim 11, wherein the plurality of pillar bumps comprises a plurality of first pillar bumps and a plurality of second pillar bumps.

16. The integrated device of claim 15, wherein the plurality of first pillar bumps are disposed in a core region of an interface between the die and the substrate and the plurality of second pillar bumps are disposed in a periphery region of the interface.

17. The integrated device of claim 15, wherein the plurality of first pillar bumps are disposed at first locations and the plurality of second pillar bumps are disposed at second locations, and wherein the first locations are associated with higher chip-package interaction (CPI) stresses than the second locations.

18. The integrated device of claim 15, wherein the plurality of first pillar bumps are disposed at first locations and the plurality of second pillar bumps are disposed at second locations, and wherein the first locations correspond to locations of via-in-pad structures of the substrate.

19. The integrated device of claim 11, wherein the at least one first pillar bump has a first characteristic dimension along a direction orthogonal to the first pillar height and the at least one second pillar bump has a second characteristic dimension along the direction, and wherein the first characteristic dimension is greater than the second characteristic dimension.

20. The integrated device of claim 11, wherein the at least one first pillar bump has a first cross-sectional shape in a plane orthogonal to the first pillar height and the at least one second pillar bump has a second cross-sectional shape in the plane, and wherein the first cross-sectional shape is different from the second cross-sectional shape.

21. A method for fabricating an integrated device, the method comprising:

electrically connecting at least one first pillar bump of a die to a first contact of a substrate, wherein the first pillar bump includes a first pillar having a first pillar height and a first solder cap having a first solder cap height; and electrically connecting at least one second pillar bump of the die to a second contact of the substrate, wherein the second pillar bump includes a second pillar having a second pillar height and a second solder cap having a second solder cap height, and wherein the second pillar height is greater than the first pillar height and the second solder cap height is less than the first solder cap height;

disposing a fill material in a region between the die and the substrate.

22. The method of claim 21, wherein electrically connecting the at least one first pillar bump of the die to the first contact of the substrate includes electrically connecting a plurality of first pillar bumps disposed in a core region of the die to core contacts of the substrate, and wherein electrically connecting the at least one second pillar bump of the die to the second contact of the substrate includes electrically connecting a plurality of second pillar bumps disposed in a periphery region of the die to periphery contacts of the substrate.

23. The method of claim 21, wherein electrically connecting the at least one first pillar bump of the die to the first contact of the substrate includes electrically connecting a plurality of first pillar bumps to a respective plurality of first contacts of the substrate, wherein electrically connecting the at least one second pillar bump of the die to the second contact of the substrate includes electrically connecting a plurality of second pillar bumps to a respective plurality of second contacts of the substrate, and wherein the first contacts are at locations associated with higher chip-package interaction (CPI) stresses than the second contacts.

24. The method of claim 21, wherein electrically connecting the at least one first pillar bump of the die to the first contact of the substrate includes electrically connecting a plurality of first pillar bumps to a respective plurality of first contacts of the substrate, wherein electrically connecting the at least one second pillar bump of the die to the second contact of the substrate includes electrically connecting a plurality of second pillar bumps to a respective plurality of second contacts of the substrate, and wherein the first contacts are at locations of via-in-pad structures of the substrate.

25. The method of claim 21, wherein the at least one first pillar bump has a first characteristic dimension along a direction orthogonal to the first pillar height and the at least one second pillar bump has a second characteristic dimension along the direction, and wherein the first characteristic dimension is greater than the second characteristic dimension.

26. The method of claim 21, wherein the at least one first pillar bump has a first cross-sectional shape in a plane orthogonal to the first pillar height and the at least one second pillar bump has a second cross-sectional shape in the plane, and wherein the first cross-sectional shape is different from the second cross-sectional shape.

27. A method for fabricating an integrated device, the method comprising:

forming, on a first contact of a die, a first pillar having a first pillar height;

forming, on the first pillar, a first solder cap having a first solder cap height;

forming, on a second contact of the die, a second pillar having a second pillar height, wherein the second pillar height is greater than the first pillar height;

forming, on the second pillar, a second solder cap having a second solder cap height, wherein the second solder cap height is less than the first solder cap height; and forming a fill material in a region between the die and a substrate.

28. The method of claim 27, further comprising:

before forming the first solder cap, forming a first barrier layer on the first pillar; and before forming the second solder cap, forming a second barrier layer on the second pillar.

29. The method of claim 27, wherein forming the first solder cap comprises performing first solder deposition operations to deposit a first metal or alloy and forming the second solder cap comprises performing second solder deposition operations to deposit a second metal or alloy different from the first metal or alloy.

30. The method of claim 27, wherein the first pillar bump is formed with a first characteristic dimension along a direction orthogonal to the first pillar height and the second pillar bump is formed with a second characteristic dimension along the direction, and wherein the first characteristic dimension is greater than the second characteristic dimension.

31. The method of claim 27, wherein the first pillar bump is formed with a first cross-sectional shape in a plane orthogonal to the first pillar height and the second pillar bump is formed with a second cross-sectional shape in the plane, and wherein the first cross-sectional shape is different from the second cross-sectional shape.

* * * * *